United States Patent
Kawaguchi (10) Patent No.: US 8,310,004 B2
(45) Date of Patent: Nov. 13, 2012

(54) SEMICONDUCTOR DEVICE AND PROCESS FOR PRODUCING THE SAME

(75) Inventor: Hiroshi Kawaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 72 days.

(21) Appl. No.: 12/887,991

(22) Filed: Sep. 22, 2010

(65) Prior Publication Data

US 2011/0068391 A1    Mar. 24, 2011

(30) Foreign Application Priority Data

Sep. 24, 2009   (JP) ................................. 2009-219635

(51) Int. Cl.
*H01L 29/76*   (2006.01)
*H01L 29/94*   (2006.01)
*H01L 31/062*  (2012.01)
*H01L 31/113*  (2006.01)
*H01L 31/119*  (2006.01)

(52) U.S. Cl. ................. 257/330; 257/332; 257/E27.091

(58) Field of Classification Search .................. 257/330, 257/331, 332, E27.091
See application file for complete search history.

(56) References Cited

U.S. PATENT DOCUMENTS

| | | | |
|---|---|---|---|
| 5,994,736 A * | 11/1999 | Sugawara et al. | 257/330 |
| 6,118,149 A | 9/2000 | Nakagawa et al. | |
| 6,452,231 B1 | 9/2002 | Nakagawa et al. | |
| 6,919,601 B2 | 7/2005 | Inaba | |
| 7,391,068 B2 | 6/2008 | Kito et al. | |
| 2005/0051843 A1 | 3/2005 | Inaba | |
| 2006/0289905 A1 | 12/2006 | Kito et al. | |
| 2008/0185639 A1 | 8/2008 | Risaki et al. | |
| 2009/0026538 A1 | 1/2009 | Hashitani | |

FOREIGN PATENT DOCUMENTS

| | | |
|---|---|---|
| JP | 52-147269 | 12/1977 |
| JP | 11-103058 | 4/1999 |
| JP | 2005-085960 | 3/2005 |
| JP | 2007-005568 | 1/2007 |
| JP | 2008-192985 | 8/2008 |
| JP | 2009-054999 | 3/2009 |

* cited by examiner

*Primary Examiner* — Hoai V Pham (74) *Attorney, Agent, or Firm* — Young & Thompson (57) ABSTRACT

A trench gate transistor whose gate changes depth intermittently in the gate width direction, has a first offset region and a second offset region formed below the source and drain, respectively. The first offset region and the second offset region are shallower where they contact the device isolation film than is the device isolation film in those areas. The first and second offset regions nevertheless extend below the bottom of the trench.

15 Claims, 10 Drawing Sheets

SEMICONDUCTOR DEVICE AND PROCESS FOR PRODUCING THE SAME

CROSS-REFERENCE TO RELATED APPLICATIONS

The disclosure of Japanese Patent Application No. 2009-219635 filed on Sep. 24, 2009 including the specification, drawings and abstract is incorporated herein by reference in its entirety.

BACKGROUND OF THE INVENTION

The present invention relates to a semiconductor device and a manufacturing method thereof.

Techniques have been proposed for forming uneven surfaces such as trenches in the channel region of a substrate, to increase the effective channel width of a transistor without increasing in size.

For example, Japanese Patent Laid-Open No. H11-103058 and Japanese Patent Laid-Open No. S51-147269 describe a semiconductor device including a trench gate structure in which trenches are formed on the substrate surface. Japanese Patent Laid-Open No. 2007-5568 describes a semiconductor device in which a plurality of projecting silicon regions are formed in the width direction of a channel region formed between a source region and a drain region which are formed on a semiconductor substrate. A gate insulating film and a gate electrode are formed facing the channel region on the silicon projections. A reduction in the pitch of the gates reduces the width of the projections and achieves full depletion of a depletion layer in the projections during the operation of transistors, thus mitigating the short channel effect and improving the subthreshold slope (Japanese Patent Laid-Open No. 2005-085960). It is also possible to use such a decrease in the substrate bias dependence of threshold voltage due to such full depletion to advantage in an appropriate circuit configuration.

Japanese Patent Laid-Open 2009-54999 describes a semiconductor device formed on a semiconductor substrate of a first conductivity type and equipped with a trench structure having a depth intermittently changing in the gate width direction, a gate electrode formed, via a gate insulating film, inside a trench portion defined by the trench structure and on the upper surface of a planar portion, a source region of a second conductivity type formed on one side of the gate electrode, and a drain region of a second conductivity type formed on the other side of the gate electrode. Portions of the source region and the drain region which face each other with the trench portion there between have a depth equal to or greater than the depth of the trench structure from the upper surface to the bottom portion. Due to this structure, a current which otherwise flows mainly around the upper surfaces of the recessed portion of the gate electrode starts flowing more uniformly through the whole trench portion, resulting in an increase in the effective gate depth of the recessed portion whose depth changes in the gate width direction. According to this document, a semiconductor device having such a configuration can have reduced on-resistance and enhanced transistor power.

Japanese Patent Laid-Open No. 2008-192985 describes a semiconductor device in which trench portions are formed in the gate width direction so as to provide a well with unevenness and a gate electrode is formed inside and on the upper surface of the trench portion via an insulating film. A source region is formed on one side of the gate electrode in the gate length direction and a drain region is formed on the other side. The source region and the drain region both have a depth reaching the vicinity of the bottom portion of the gate electrode (the vicinity of the bottom portion of the trench portion). By forming the source region and the drain region of such a depth, a current which otherwise flows mainly around a shallow portion of the gate electrode starts flowing more uniformly through the whole trench portion and an effective gate width increases due to the unevenness formed in the well. According to this document, a semiconductor device having such a configuration can have reduced on-resistance and enhanced transistor power.

The present inventors have however found that these techniques have various problems. In the configuration described in Japanese Patent Laid-Open No. 2009-54999, a high-concentration n-type source region and drain region are in direct contact with a p well of a different conductivity type. Such a configuration makes it difficult to ensure a high breakdown voltage. For example, in order to ensure a breakdown voltage as high as about 20V or greater, it is preferred to provide, between the high-concentration source region and a channel region and between the high-concentration drain region and the channel region, a so-called offset region or a DDD (deeply doped drain) region, that is, a low-concentration region having a dopant concentration lower than that of the source region or the drain region.

When a low-concentration region is provided, on the other hand, the low-concentration region having a depth greater than that of a device isolation insulating film is likely to cause conduction through a substrate region below the device isolation insulating film, causing deterioration in device isolation ability.

According to the conventional techniques, it is impossible to ensure a high breakdown voltage as described above and at the same time, prevent deterioration of device isolation ability.

SUMMARY

According to the present invention, there is provided a semiconductor device including: a substrate; a device isolation film formed on the substrate; a source region and a drain region, both of which are of a first conductivity type; a channel region of a second conductivity type between the source region and the drain region; a trench formed in the substrate between the source region and the drain region; a gate electrode formed in the trench; a first low-concentration region of the first conductivity type, between the source region and the channel region, having a first conductivity type dopant concentration lower than that of the source region; and a second low-concentration region of the first conductivity type, between the drain region and the channel region, having a first conductivity type dopant concentration lower than that of the drain region, wherein in regions where the first low-concentration region and the second low-concentration region contact respective portions of the device isolation film, the first and second low-concentration regions are each shallower than the device isolation film.

The present invention also relates to a method of manufacturing a semiconductor device, comprising: forming a device isolation region on a substrate; implanting dopant ions of a first conductivity type in the substrate to form a first region and a second region, both of which are of a first conductivity type; implanting dopant ions of a second conductivity type between the first region and the second region to form a channel region; forming a first mask for forming a gate region in the channel region; forming a trench in the substrate by use of the mask; forming a gate electrode in the trench formed on the substrate; and implanting, in the vicinity of the surface of the substrate on the first region and the second region, dopant ions of the first conductivity type having a dopant concentration higher than that of the first region and the second region to form a source region and a drain region, wherein in the step of forming the first region and the second region, both of which are of the first conductivity type, the first region and the second region are formed so that in regions where the first region and the second region contact respective portions of the device isolation film, the first region and the second region are formed to a shallower depth than the device isolation film.

According such a configuration, low-concentration regions which are of the same conductivity type as that of the drain region and the source region are formed between the drain region and the channel region and between the source region and the channel region, respectively, so that the resulting transistor can have a high breakdown voltage. In addition, in regions where the low-concentration regions contact the device isolation insulating films, respectively, the lower end of the low-concentration regions is located above the lower end of the device isolation insulating film. This makes it possible to prevent deterioration of the device isolation ability without the need for additional measures such as increasing the width of the device isolation insulating film. This in turn makes it possible to prevent an increase in the chip size.

BRIEF DESCRIPTION OF DRAWINGS

The above and other objects, advantages and features of the present invention will be more apparent from the following description taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings, like components bear like reference numerals and descriptions of such components are not necessarily repeated.

Figure 1A:
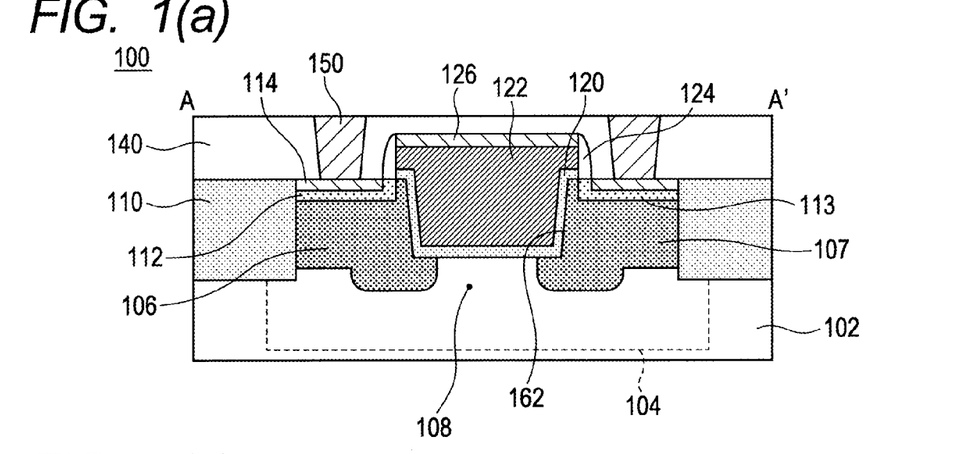
FIGS. 1(a), 1(b), and 1(c) are sectional views illustrating a semiconductor device according to one embodiment of the present invention.
Figure 1B:
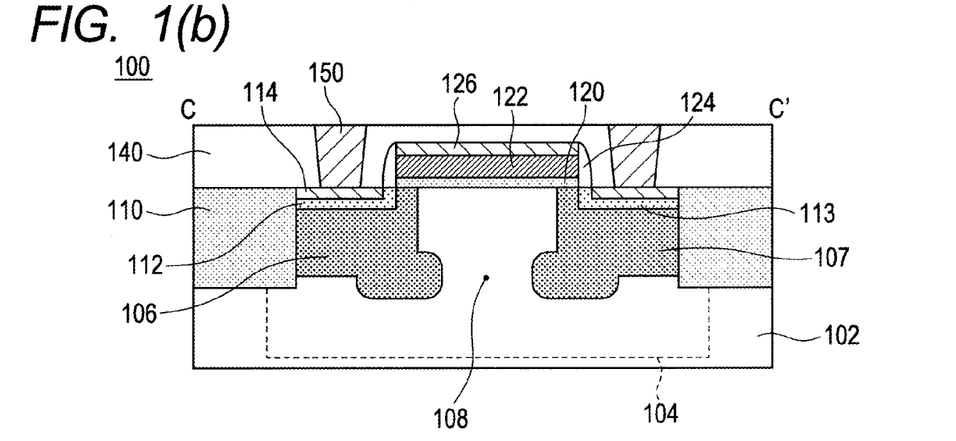
Figure 1C:
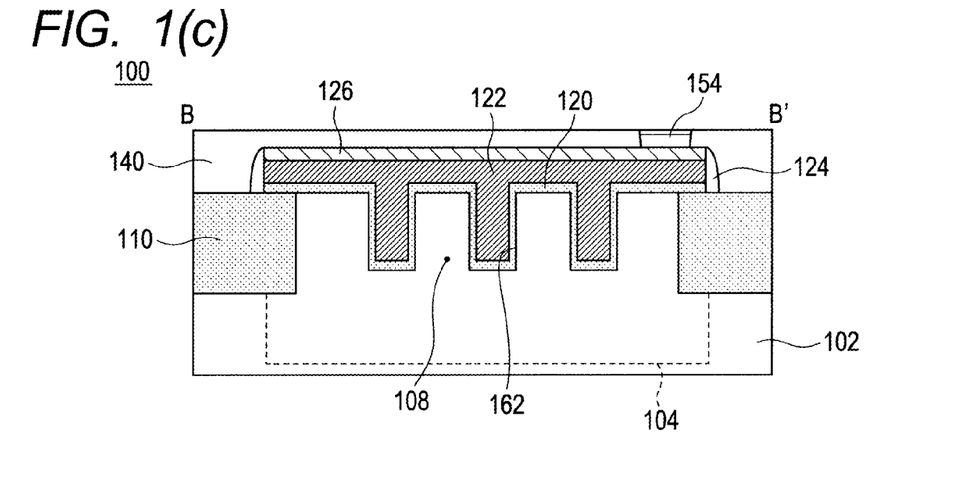
Figure 2:
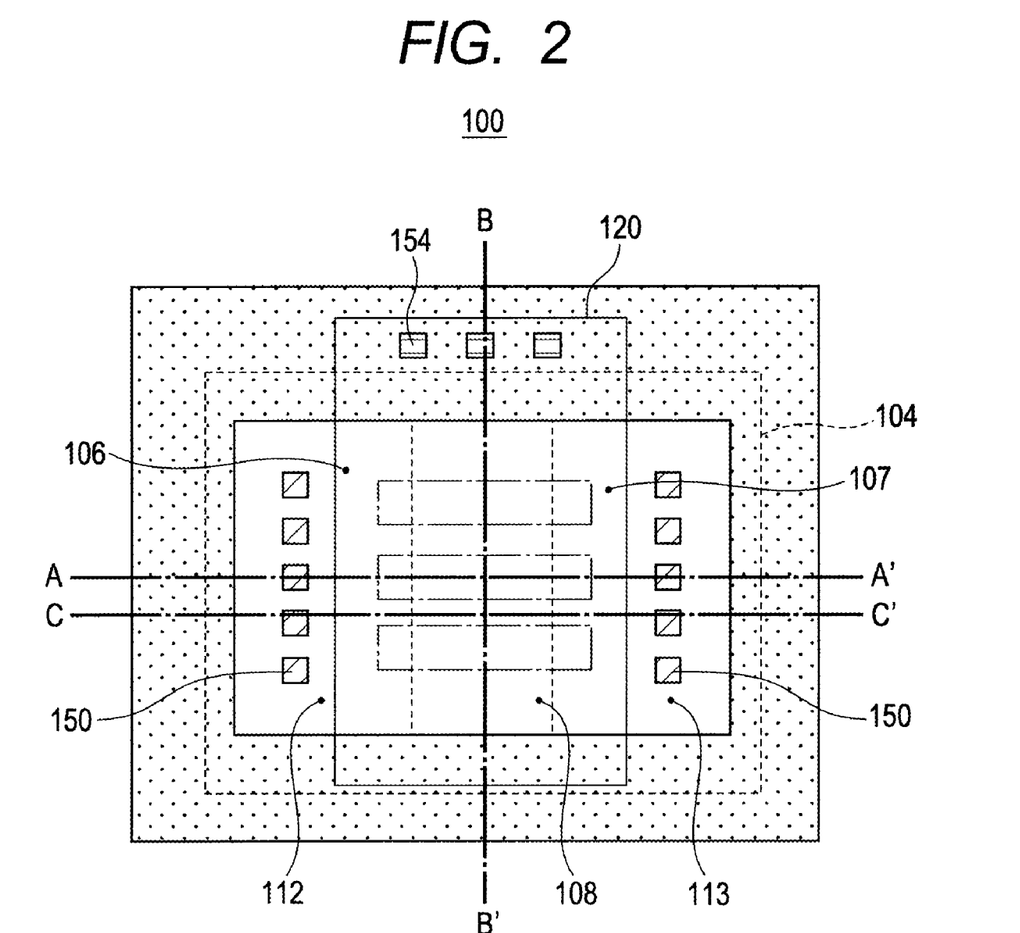
FIG. 2 is a plan view of the embodiments of FIGS. 1(a), 1(b) and 1(c) and FIG. 15.

FIGS. 1(a), 1(b), and 1(c) are sectional views illustrating an embodiment of a semiconductor device according to the present invention. FIG. 2 is a plan view illustrating the embodiment of FIGS. 1(a), 1(b), and 1(c). FIG. 1(a) is a section along the line A-A' of FIG. 2; FIG. 1(b) is a section along the line C-C' of FIG. 2; and FIG. 1(c) is a section along the line B-B' of FIG. 2. To ensure that the configuration is easily understandable, in FIG. 2 each region is indicated by lines alone. In the following, a case where a first conductivity type is an n-type and a second conductivity type is a p-type is described as an example. However, a reverse case may also be applied to the present invention.

A semiconductor device 100 includes a substrate 102 and transistors formed on one surface of the substrate 102. The substrate 102 can be a semiconductor substrate such as a silicon substrate. A device isolation insulating film 110 is formed on that surface of the substrate 102. The device isolation insulating film 110 can have, for example, an STI (shallow trench isolation) configuration.

In a region isolated by the device isolation insulating film 110, there are formed a well 104, which is a diffusion region of a dopant of a second conductivity type (p-type), a source region 112 and a drain region 113, which are diffusion regions of a dopant of a first conductivity type (n-type), and a first offset region 106 (a first low-concentration region) and a second offset region 107 (a second low-concentration region) which are provided underlying the source region 112 and the drain region 113, respectively, and are diffusion regions of a dopant of the first conductivity type (n-type). The first offset region 106, the second offset region 107, the source region 112, and the drain region 113 are formed within the well 104. A region of the well 104 provided between the source region 112 and the drain region 113 and delimited by the offset region 106 and the second offset region 107 becomes a channel region 108. In FIGS. 1(a) to 1(c), the well 104 is indicated solely in broken line for ease of understanding.

The semiconductor device 100 includes, in the channel region 108 on the device side of the substrate 102, trenches 162 whose depth changes intermittently in the gate width direction, a gate electrode 122 formed so as to fill the trenches 162, a gate insulating film 120 formed between the gate electrode 122 and the substrate 102, and side walls 124 formed on the upper sidewall of the gate electrode 122. In this embodiment, a silicide layer 114 is formed on the surfaces of the source region 112 and the drain region 113 and a silicide layer 126 is formed on the surface of the gate electrode 122. An interlayer dielectric film 140 is formed on the substrate 102. In the interlayer dielectric film 140, there are formed contacts 150 which are connected to the silicide layers 114, respectively, on the source region 112 and the drain region 113 and a contact 154 connected to the silicide layer 126 on the gate electrode 122.

In this embodiment, the first offset region 106 contacts the device isolation insulating film 110 and is formed underlying the entire surface of the source region 112 extending from the device isolation insulating film 110 to the trench 162. The second offset region 107 contacts the device isolation insulating film 110 and is formed underlying the entire surface of the drain region 113 extending from the device isolation insulating film 110 to the trench 162. The first offset region 106 and the second offset region 107 have a first conductivity type dopant concentration lower than that of the source region 112 and the drain region 113. In this embodiment, the first offset region 106 and the second offset region 107, both of which are low-concentration regions, are formed on the side of the trench 162, on the lower corners of the trench 162, and on a predetermined portion of the bottom of the trench 162. The lower corners of the trench 162 are covered by the first offset region 106 and the second offset region 107. Thanks to the above configuration, the transistor power can be kept high.

In this embodiment, the first offset region 106 and the second offset region 107 are formed so that the lower ends thereof, where they contact the device isolation insulating film 110, are shallower than the device isolation insulating film 110. In other words, the offset regions extend less deeply into the semiconductor substrate, as measured from the device side of the substrate, than does the isolation film, at least in those areas where the offset regions contact the isolation film.

Further, in this embodiment, the first offset region 106 and the second offset region 107 each has a depth, in the area where they contact the bottom of trench 162, greater than their depth where they make contact with the device isolation insulating film 110. This means that, in a sectional view, the first offset region 106 and the second offset region 107 each has a step difference which is deeper on the side near the trench 162 and shallower on the side near the device isolation insulating film 110.

In the present embodiment, the film thickness of the device isolation insulating film 110 can be on the order of, for example, 300 nm to 1 μm. The depth of the trench 162 can be on the order of, for example, 500 nm to 2 μm. Although trench 162 in this embodiment has a depth less than that of the device isolation insulating film 110, it may instead be greater. Such a configuration makes it possible to prevent deterioration of the device isolation ability while keeping the breakdown voltage and transistor power at desired levels.

In the present embodiment, the n-type dopant concentration of the first offset region 106 and the second offset region 107 can be on the order of, for example, $1 \times 10^{16}$ atoms/cm$^3$ to $1 \times 10^{18}$ atoms/cm$^3$. The n-type dopant concentration of the source region 112 and the drain region 113 can be on the order of, for example, $1 \times 10^{20}$ atoms/cm$^3$ to $1 \times 10^{22}$ atoms/cm$^3$. The boundary between the source region 112 and the first offset region 106 and the boundary between the drain region 113 and the second offset region 107 can be, for example, a position where the first conductivity type dopant concentration is $1 \times 10^{18}$ atoms/cm$^3$. The depth of the source region 112 and the drain region 113 can be on the order of, for example, 100 to 200 nm.

Next, a procedure for manufacturing the semiconductor device 100 in this embodiment will be described.

FIGS. 3(a) and 3(b) to FIG. 8 are sectional views illustrating an example of steps of a procedure for manufacturing the semiconductor device 100 in this embodiment. These figures correspond to the A-A' sectional views and B-B' sectional view of FIG. 2, respectively.

The following description refers to forming n-type transistors, but the technique could likewise be applied to forming p-type transistors.

Figure 3A:
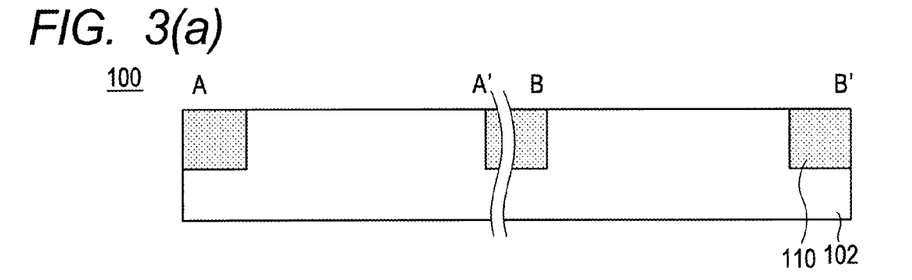
FIGS. 3(a) and 3(b) are sectional views illustrating an example of a process for manufacturing the semiconductor device of the embodiment of FIGS. 1(a), 1(b) and 1(c)

First, a device isolation insulating film 110 is formed on one surface of a substrate 102 (FIG. 3(a)). Subsequently, a first offset region 106 and a second offset region 107 are formed on that surface of the substrate 102. In this embodiment, each of the first offset region 106 and the second offset region 107 can be formed by carrying out ion implantation in two stages.

Figure 9:
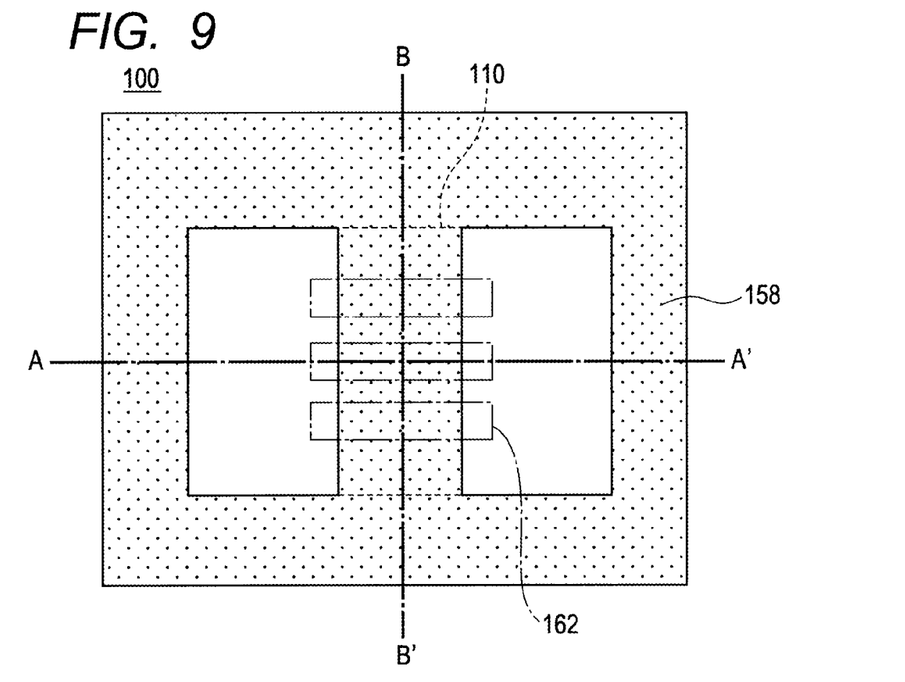
FIG. 9 is a plan view illustrating a stage during the process of FIGS. 3-8.

First, a resist film 158 with openings corresponding to the intended locations of the first offset region 106 and the second offset region 107, is formed on one surface of the substrate 102. FIG. 9 is a plan view illustrating the substrate at this stage. Subsequently, by use of the resist film 158 as a mask, the first offset region 106 and the second offset region 107 are formed on the whole exposed area of the substrate 102 by performing ion implantation of dopant ions of an n-type (a first conductivity type) such as phosphorus ions (FIG. 3(b)). The ion implantation can be performed in a vertical direction. After that, the resist film 158 is removed.

Figure 10:
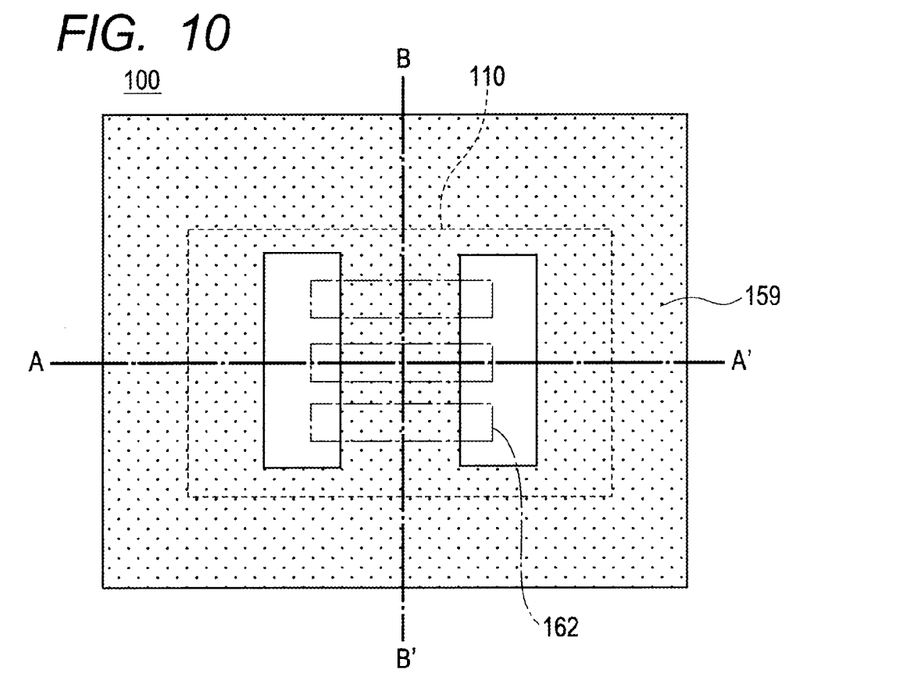
FIG. 10 is a plan view illustrating another stage during the process of FIGS. 3-8.

Subsequently, on the same surface of the substrate 102, a resist film 159 is formed whose openings correspond with the regions where the first offset region 106 and the second offset region 107 will contact trench 162. FIG. 10 is a plan view showing the substrate at this stage. It will be noted that the openings in resist film 159 do not overlap the isolation film 110 in either the gate length direction or in the width direction. Dopant ions of an n-type (a first conductivity type) such as phosphorus ions are then implanted into the areas of the substrate 102 exposed through mask 159 (FIG. 4(a)). In this step, ion implantation is performed to target the region shown in broken line in FIG. 4(a). This means that the ion implantation is performed more deeply in this stage as compared with the ion implantation illustrated in FIG. 3(b). After that, the resist film 159 is removed.

Figure 3B:
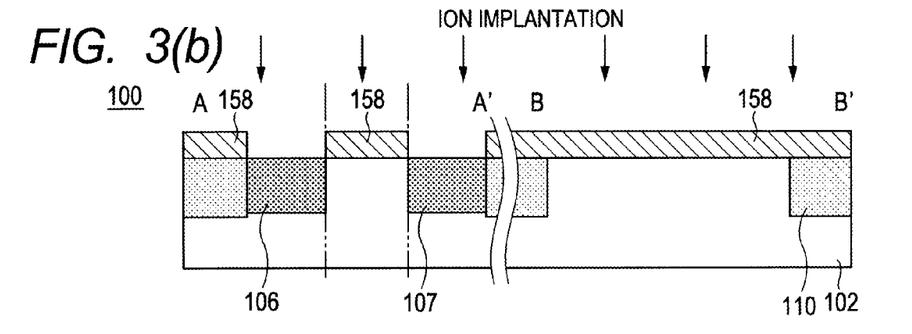
Figure 4A:
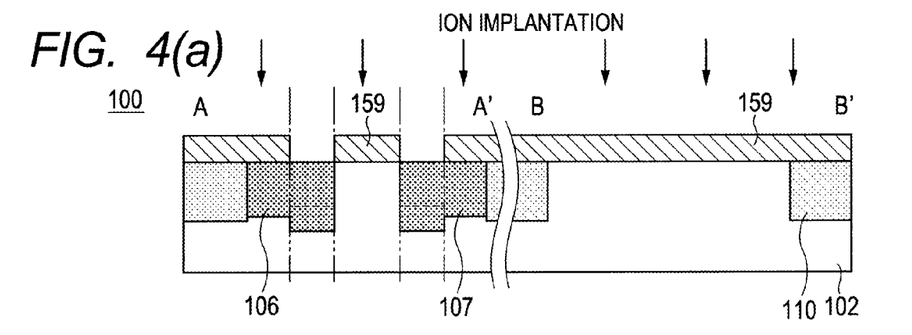
FIGS. 4(a) and 4(b) are sectional views illustrating steps succeeding those of FIGS. 3(a) and 3(b) in the process for manufacturing the semiconductor device of the embodiment of FIGS. 1(a), 1(b) and 1(c)
Figure 4B:
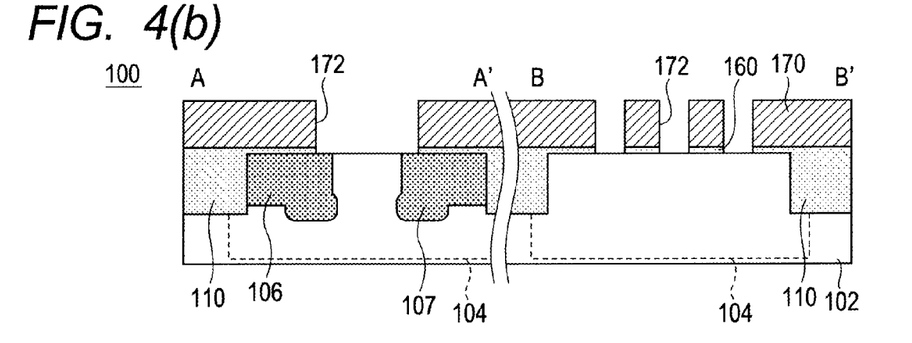

The ion implantation illustrated in FIG. 3(b) and the ion implantation illustrated in FIG. 4(a) may also be performed in the reverse order. The dopant ions configuring the first offset region 106 and the second offset region 107 are then preferably diffused in a diffusion step such as by heat treatment after the ion implantation.

Subsequently, although not illustrated, a resist film with opening corresponds to the location of well 104 is formed on the substrate 102. By use of that resist film as a mask, the well 104 is formed on the whole exposed area of the substrate by performing ion implantation of dopant ions of a p-type (a second conductivity type) such as boron (B). The p-type dopant concentration of the well 104 can be on the order of, for example, 1E15 atoms/cm$^3$ to 1E17 atoms/cm$^3$. After that, the resist film is removed.

Subsequently, a thermally-oxidized film 160 is formed on the device-side surface of the substrate 102 and on top of this thermally-oxidized film 160 there is formed a resist film 170 in which an opening 172 for forming a trench 162 is formed. Next, the substrate 102 is etched through the opening 172 to remove the thermally-oxidized film 160 using the resist film 170 as a mask, (FIG. 4(b)). After that, the trench 162 is formed on the substrate 102 by plasma etching the substrate 102 using the resist film 170 as a mask (FIG. 5(a)). After that, the resist film 170 is removed.

It is possible to adopt another method such as removing the thermally-oxidized film 160 within the opening 172 by use of the resist film 170 as a mask, removing the resist 170 thereafter, and forming the trench 162 by use of the remaining thermally-oxidized film 160 as a mask.

Figure 5A:
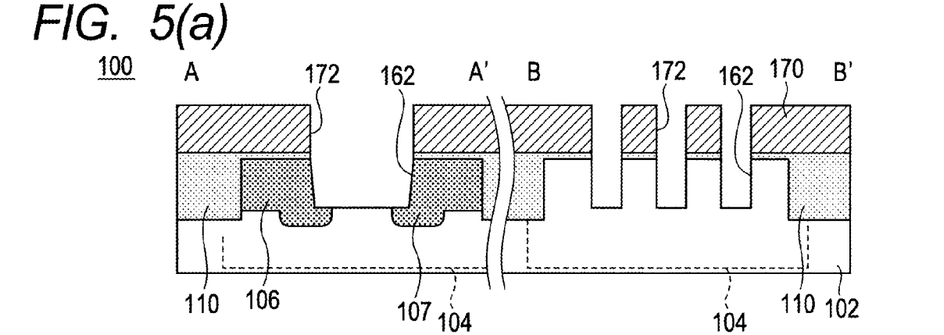
FIGS. 5(a) and 5(b) are sectional views illustrating steps succeeding those of FIGS. 4(a) and 4(b) in the process for manufacturing the semiconductor device of the embodiment of FIGS. 1(a), 1(b) and 1(c)
Figure 5B:
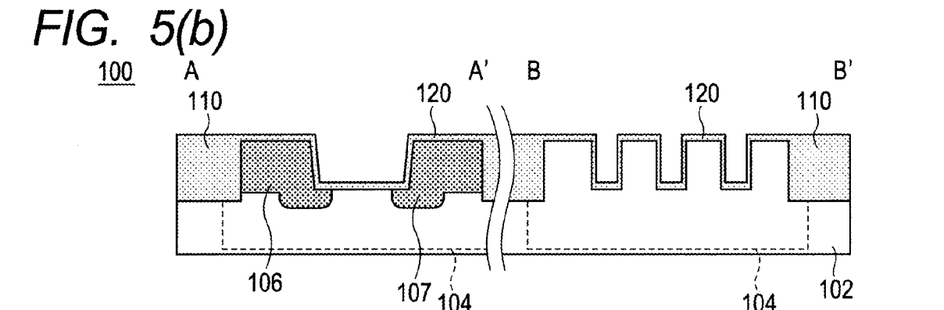
Figure 6A:
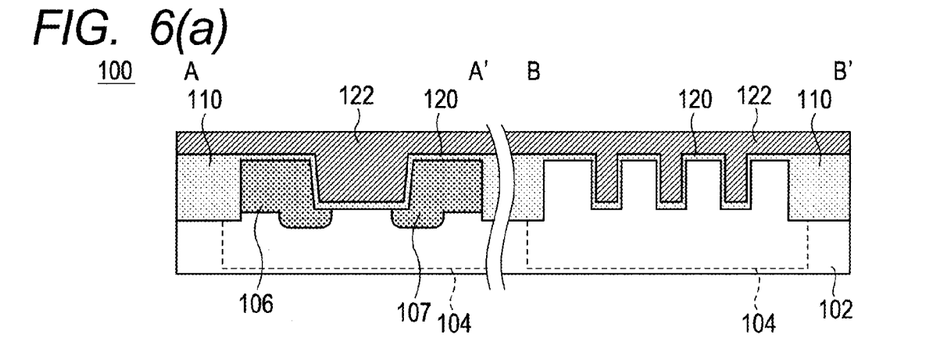
FIGS. 6(a) and 6(b) are sectional views illustrating steps succeeding those of FIGS. 5(a) and 5(b) in the process for manufacturing the semiconductor device of the embodiment of FIGS. 1(a), 1(b) and 1(c)
Figure 6B:
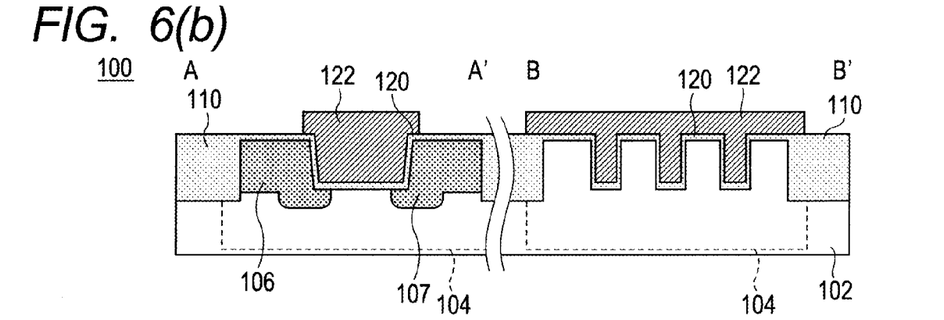

Subsequently, after the temporary removal of the thermally-oxidized film 160 with diluted fluorine or the like, a gate insulating film 120 is formed in the trench 162 and on the surface of the substrate 102 by thermally oxidizing the surface of the substrate 102 (FIG. 5(b)). After that, a conductive film which becomes a gate electrode 122, is formed on the whole area of the substrate 102 (FIG. 6(a)). The conductive film which becomes the gate electrode 122 can be formed from polysilicon, for example. Next, the gate electrode 122 and the gate insulating film 120 are patterned in a gate shape (FIGS. 6(b) and 7(a)).

Figure 7A:
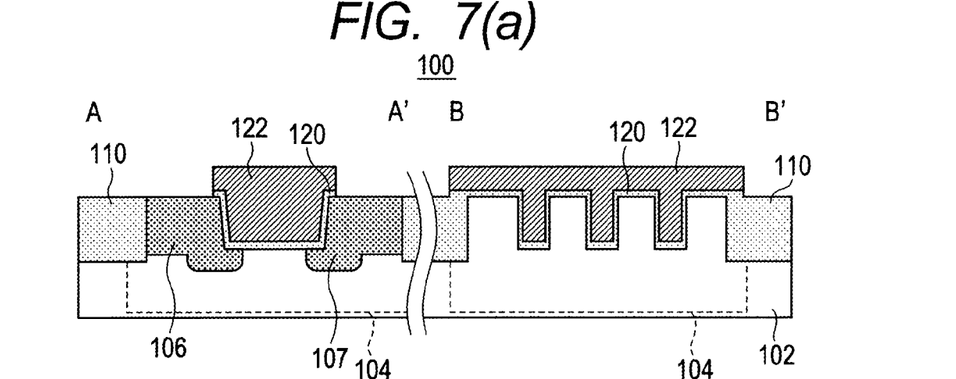
FIGS. 7(a) and 7(b) are sectional views illustrating steps succeeding those of FIGS. 6(a) and 6(b) in the process for manufacturing the semiconductor device of the embodiment of FIGS. 1(a), 1(b) and 1(c)
Figure 7B:
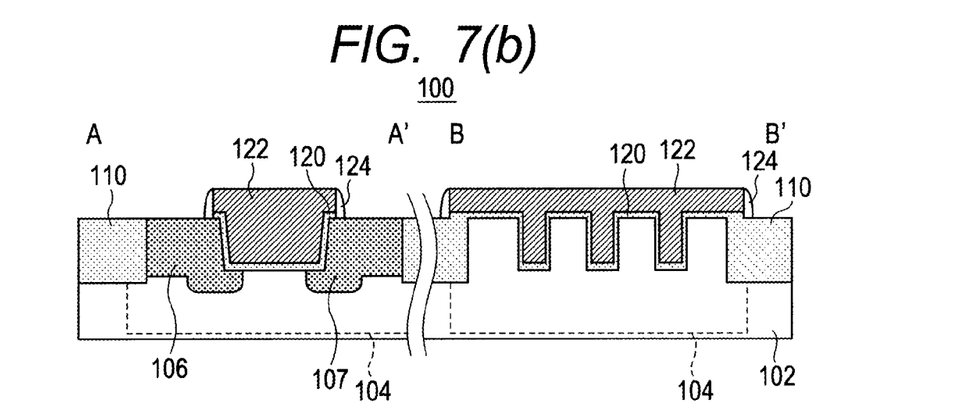
Figure 8:
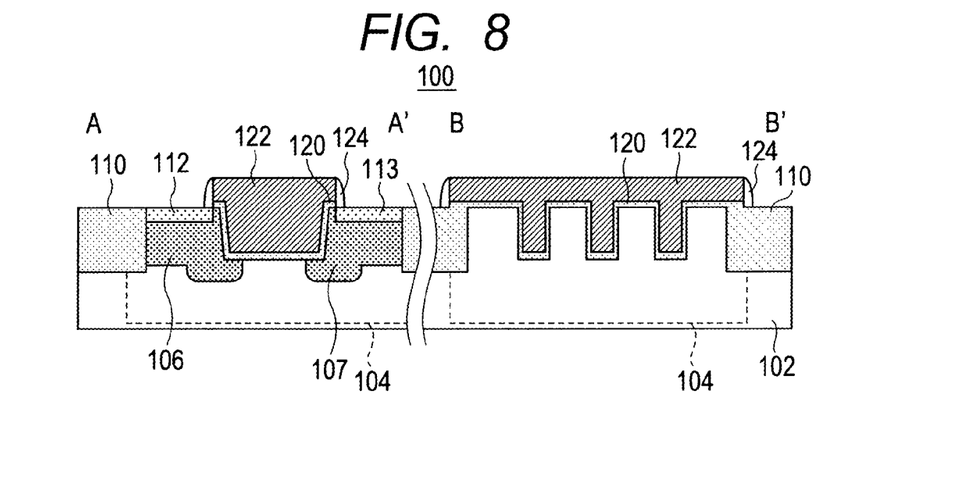
FIG. 8 is a sectional view illustrating steps succeeding those of FIGS. 7(a) and 7(b) in the process for manufacturing the semiconductor device of the embodiment of FIGS. 1(a), 1(b) and 1(c)

Subsequently, a side wall 124 is formed on the upper side wall of the gate electrode 122 (FIG. 7(b)). The side wall 124 can be formed from an insulating film of an oxide film, a nitride film or the like. After that, a source region 112 and a drain region 113 are formed by ion implantation of n-type dopant ions, such as phosphorus (P) ions, on the substrate 102 using gate electrode 122 and side wall 124 as masks (FIG. 8). In this embodiment, the source region 112 and the drain region 113 are manufactured using ion implantation conditions different from those employed for the first offset region 106 and the second offset region 107. This makes it possible to form the first offset region 106 and the second offset region 107 into desired shapes and keep the breakdown voltage of the transistor desirably high.

Subsequently, a silicide layer 114 and a silicide layer 126 are formed on the surface of the substrate 102 and the surface of the gate electrode 122, respectively. As a result of this, the semiconductor device 100 of the configuration shown in FIGS. 1(a) to 1(c) can be obtained.

According to the above procedure, in this embodiment, the first offset region 106 and the second offset region 107 are formed so that their depth in regions adjacent to the trench 162 and below the bottom of the trench 162 are greater than their depth in regions adjacent to the device isolation insulating film 110. In this embodiment, the first offset region 106 and the second offset region 107 can therefore be formed so that they cover the lower corners of the trench 162 and cover the entire area underlying the source region 112 and the drain region 113, respectively. In addition, the first offset region 106 and the second offset region 107 can be formed so that in the regions adjacent to the device isolation insulating film 110 they extend only to a shallower depth than the adjacent regions of the device isolation insulating film 110.

Another embodiment of the method for making a semiconductor device 100 will now be described.

FIGS. 11(a) and 11(b) to FIGS. 12(a) and 12(b) are sectional views illustrating steps of a procedure for manufacturing the semiconductor device 100 in this example. This method differs from that described previously mainly in that the first offset region 106 and the second offset region 107 are formed after forming trench 162.

First, a device isolation insulating film 110 is formed on a substrate 102 in the same way as the procedure described with reference to FIG. 3(a). Then, without forming a first offset region 106 and a second offset region 107 in this stage, a well 104 is formed in the same way as described above. Subsequently, a thermally-oxidized film 160 is formed on one surface of the substrate 102, and on top of this thermally-oxidized film 160 there is formed a resist film 170 in which an opening 172 for forming a trench 162 is formed. Next, the substrate 102 is exposed within the opening 172 by removing the thermally-oxidized film 160 by etching using the resist film 170 as a mask (FIG. 11(a)).

Figure 11A:
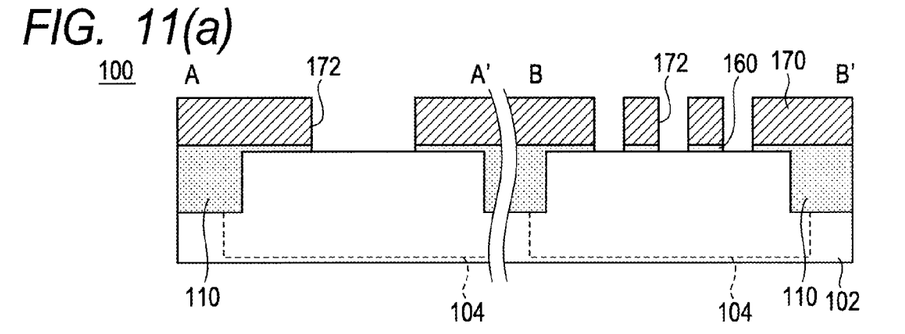
FIGS. 11(a) and 11(b) are sectional views illustrating another embodiment of a process for manufacturing a semiconductor device according to the present invention.
Figure 11B:
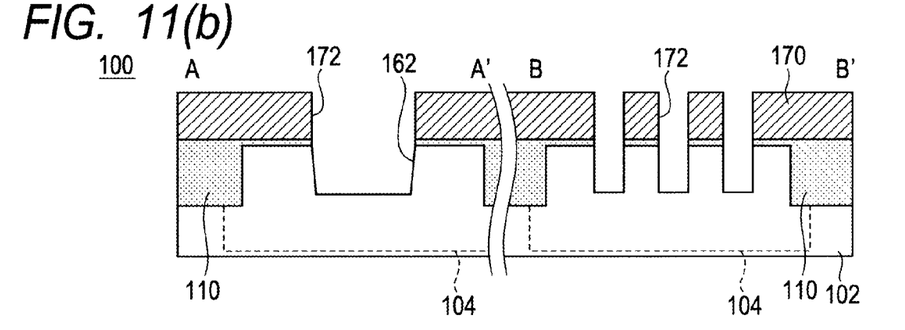

Subsequently, the trench 162 is formed on the substrate 102 by plasma etching the substrate 102 using the resist film 170 as a mask (FIG. 11(b)). After that, the resist film 170 is removed.

Figure 13:
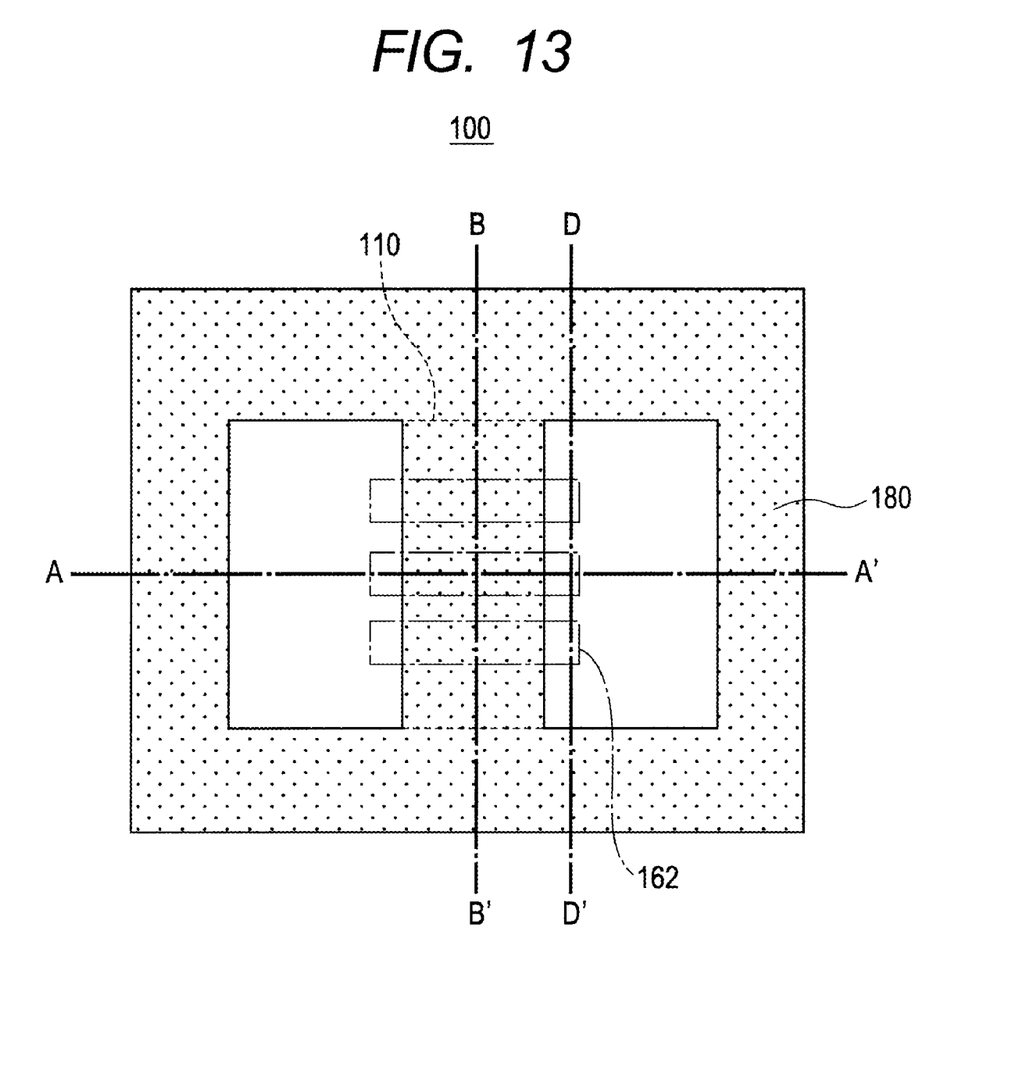
FIG. 13 is a plan view a stage during the process of FIGS. 11 and 12.

A resist film 180 with openings corresponding to the intended locations of the first offset region 106 and the second offset region 107 is formed on one surface of the substrate 102. FIG. 13 is a plan view illustrating the substrate at this stage. The opening pattern of the resist film 180 can be made similar to the opening pattern of the resist film 158 illustrated in FIG. 9.

Figure 12A:
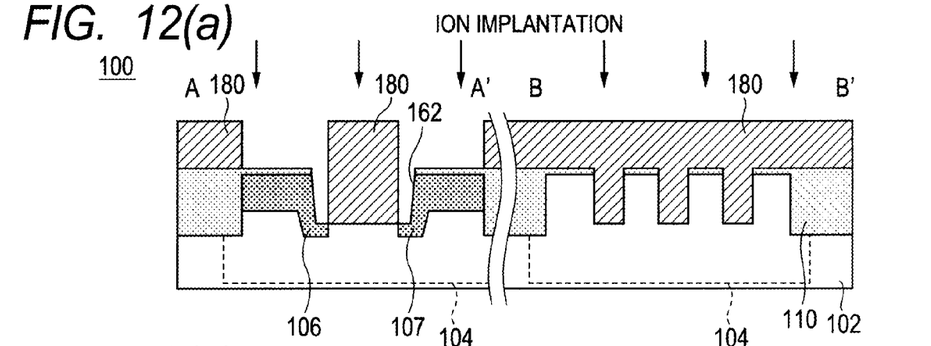
FIGS. 12(a) and 12(b) are cross-sectional views illustrating steps succeeding those of FIGS. 11(a) and 11(b) in the process for manufacturing the semiconductor device of the embodiment of FIGS. 11(a) and 11(b)
Figure 12B:
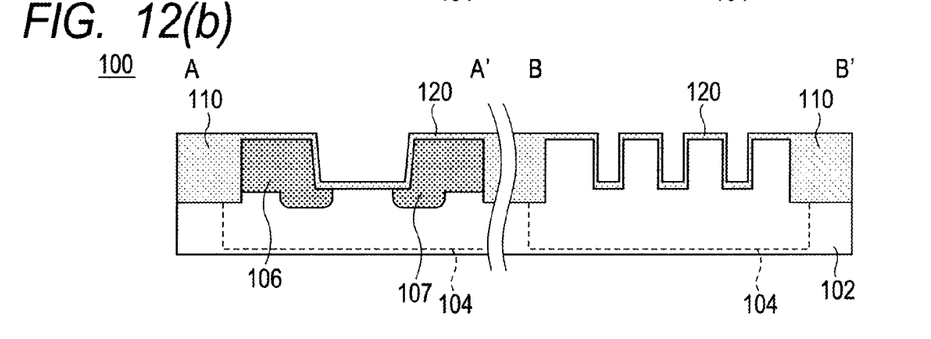

Subsequently, using the resist film 180 as a mask, the first offset region 106 and the second offset region 107 are formed on the exposed surfaces of the substrate 102 by ion implantation of dopant ions of an n-type (first conductivity type) such as phosphorus ions (FIG. 12(a)). The ion implantation may be carried out in a vertical direction. In addition, in this example, both the first offset region 106 and the second offset region 107 can be formed by single ion implantation.

Figure 14A:
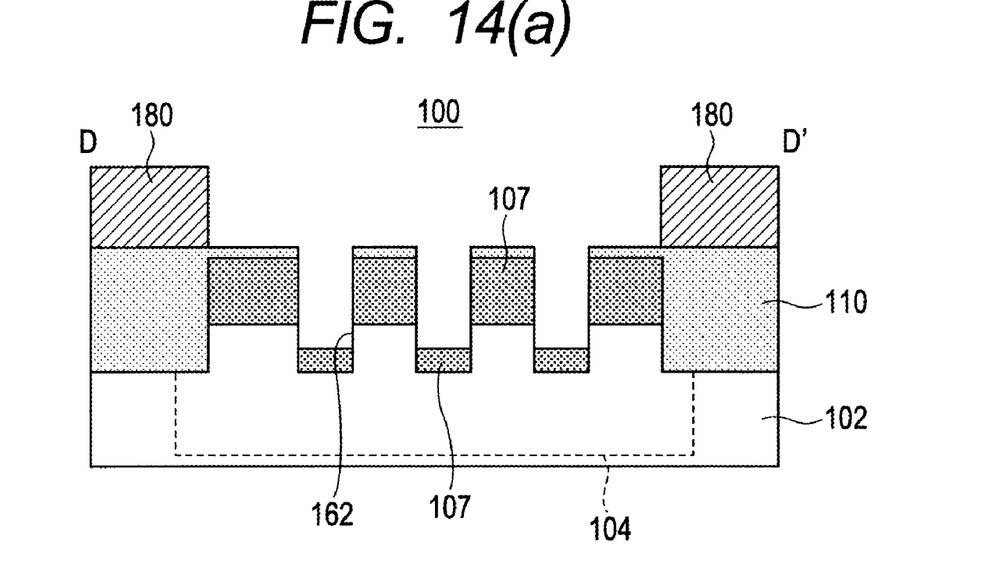
FIGS. 14(a) and 14(b) are sectional views along the line the D-D' of FIG. 13.

FIG. 14(a) is a sectional view along the line D-D' of FIG. 13 after ion implantation. The resist film 180 is then removed.

Figure 14B:
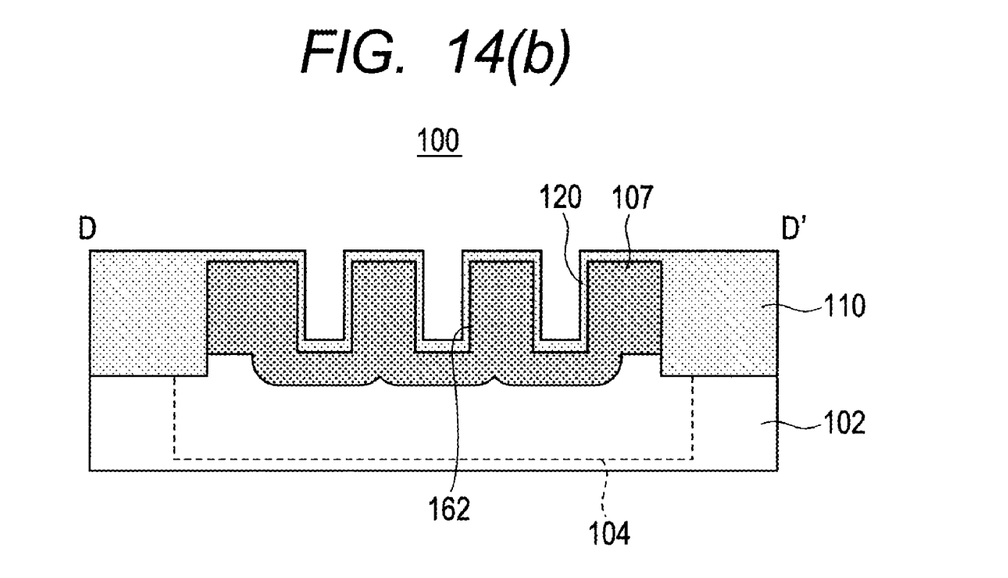

The whole surface of the substrate 102 is then heat treated. The heat treatment may be performed to form a gate insulating film 120 on one surface of the substrate 102 or to form a thermally-oxidized film different from the gate insulating film 120. It is also possible to perform heat treatment not for forming a thermally-oxidized film but for carrying out heat treatment in a nitrogen atmosphere. When a thermally-oxidized film different from the gate insulating film 120 is formed, removal of the thermally-oxidized film may be followed by the formation of the gate insulating film 120. By such a heat treatment, the dopant ions are diffused and the second offset region 107 is formed below the trench 162, as illustrated in FIG. 14(b), in a D-D' sectional view of FIG. 13. Similarly, in the first offset region 106 on the side of the source region 112, the first offset region 106 is formed below the trench 162 (FIG. 12(b)). This makes it possible to provide a dopant distribution condition which can be regarded uniform, in the gate width direction, in the device operation. Thus, according to the procedure of ion implantation after formation of the trench 162, the dopant ions can be implanted deeply at the end portion of the trench 162 and the dopant ions can be implanted shallowly in a region adjacent to the device isolation insulating film 110 so that both the first offset region 106 and the second offset region 107 can be formed by a single ion implantation step.

Also by the above-described procedure, the semiconductor device 100 having a configuration similar to that described above with reference to FIGS. 1(a) to 1(c) and FIGS. 3(a) and 3(b) to FIG. 10 can be obtained.

The advantage of the semiconductor device 100 in this embodiment will next be described.

In this embodiment, since the first offset region 106 and the second offset region 107 having a low concentration and of the same conductivity type as that of the source region 112 and the drain region 113 are formed between the source region 112 and the channel region 108 and between the drain region 113 and the channel region 108, respectively, it is possible to increase the breakdown voltage of the transistor. In addition, in regions where the first offset region 106 and the second offset region 107 are brought into contact with the device isolation insulating film 110, respectively, the lower ends of the first offset region 106 and the second offset region 107 are located above the lower end of the device isolation insulating film 110. It is therefore possible to prevent deterioration of the device isolation ability without necessarily carrying out additional measures such as increasing the width of the device isolation insulating film 110. This in turn makes it possible to prevent an increase in the chip size.

In addition, the first offset region 106 and the second offset region 107 are formed on the sides, lower corners and bottom of the trench 162 in which the gate electrode 122 is to be formed, making it possible to keep the transistor power high.

Increasing the depth of the trench 162 leads to an increase in the channel width and improvement in the capacity of the transistor. When the depth of the trench 162 is increased and at the same time, the first offset region 106 and the second offset region 107 extended below the lower corners and the bottom of trench 162, the first offset region 106 and the second offset region 107 necessarily also have an increased depth. In this embodiment, the depth of the first offset region 106 and the second offset region 107 in the areas where they will contact the trench 162 is greater than the depth of the first offset region 106 and the second offset region 107 in the areas where they will contact the device isolation insulating film 110. Even if the depth of the trench 162 is increased with a consequent increase in the depth of the first offset region 106 and the second offset region 107 in the areas that will contact trench 162, the depth of the first offset region 106 and the second offset region 107 in the areas where they will contact the device isolation insulating film 110 can still be kept shallower than the device isolation insulating film 110 in those areas. As a result, it is possible to improve the transistor power while keeping the device isolation ability.

The offset regions are formed, in the gate length direction, from the device isolation insulating film to an area underlying the bottom of the trench in which the gate electrode is to be formed. The offset regions are thus formed also on the side of the trench and on the lower corners of the trench. Thanks to the above configuration, the transistor power can be kept high.

Certain preferred embodiments of the present invention were described above with reference to the drawings. However, these embodiments are merely illustrative of the present invention and it is possible to adopt various configurations other than those described above.

Figure 15A:
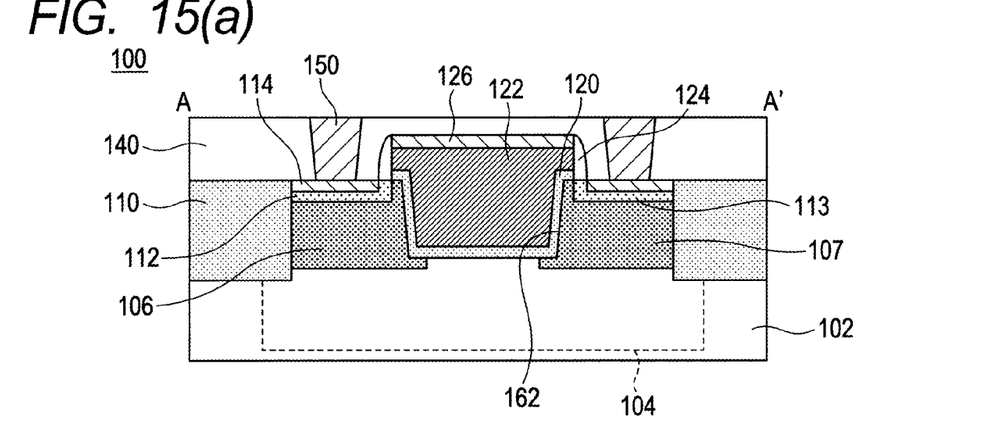
FIGS. 15(a), 15(b), and 15(c) are sectional views illustrating a further embodiment of a semiconductor device according to the present invention.
Figure 15B:
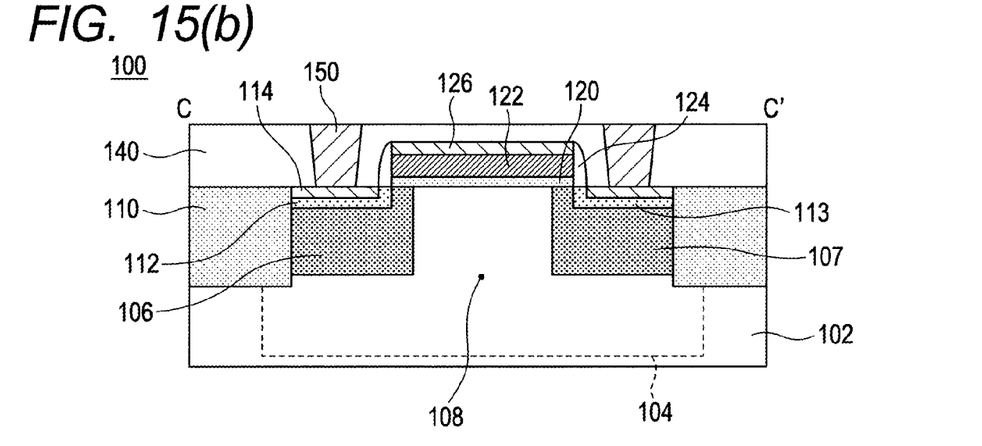
Figure 15C:
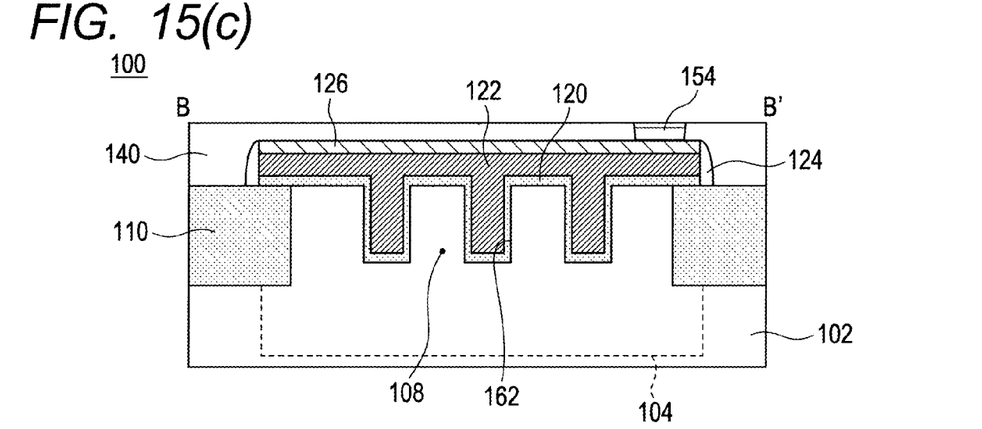

In the above embodiments, an example of the first offset region 106 and the second offset region 107 different in depth between a region adjacent to the device isolation insulating film 110 and a region adjacent to the trench 162 was shown. When the trench 162 is made shallower than the lower end of the device isolation insulating film 110, it is possible to adjust the depth of each of the first offset region 106 and the second offset region 107 to be uniform throughout both regions. Such a configuration is illustrated in FIGS. 15(a) to 15(c). FIG. 15(a) is a section along the line A-A' of FIG. 2; FIG. 15(b) is a section along the line C-C' of FIG. 2; and FIG. 15(c) is a section along the line B-B' of FIG. 2. Even in such a configuration, the first offset region 106 and the second offset region 107 can be formed so that each of them covers the a lower corner of the trench 162 and are formed underlying the entire area of each of the source region 112 and the drain region 113. In addition, the first offset region 106 and the second offset region 107 can be formed so that the lower end of them in the region adjacent to the device isolation insulating film 110 is located above the lower end of the device isolation insulating film 110 in that area. This makes it possible to prevent deterioration of device isolation ability while keeping the breakdown voltage of the transistor high.

What is claimed is:

1. A semiconductor device comprising:
a substrate;
a device isolation film formed in the substrate and having a first depth in the substrate;
a source region and a drain region, both of which are of a first conductivity and arranged in the substrate;
a channel region of a second conductivity arranged, in the substrate, in a first direction between the source region and the drain region;
a first low-concentration region of the first conductivity formed in the substrate between the source region and the channel region and having a first conductivity dopant concentration lower than a first conductivity dopant concentration of the source region;
a second low-concentration region of the first conductivity formed in the substrate between the drain region and the channel region and having a first conductivity dopant concentration lower than a first conductivity dopant concentration of the drain region,
a trench formed in the substrate between the first low-concentration region and the second low-concentration region and having a side surface extending in the first direction between the first low-concentration region and the second low-concentration region;
a gate insulating film formed in the trench; and
a gate electrode formed in the trench through the gate insulating film and having a second depth in the substrate,
wherein the second depth of the gate electrode serves as a gate width such that a portion of the channel region sideward, in a second direction crossing the first direction, from the side surface of the trench is arranged between the first low-concentration region and the second low-concentration region,
wherein the first low-concentration region and the second low-concentration region each includes a first portion extending in said substrate, having a third depth shallower than the first depth of the device isolation film and contacting the device isolation film at a depth shallower than the first depth of the device isolation film.

2. The semiconductor device according to claim 1, wherein a plurality of trenches are formed along the second direction.

3. The semiconductor device according to claim 1, wherein the first low-concentration region and the second low-concentration region each includes a second portion contacting the trench and extending below a lower corner of the trench.

4. The semiconductor device according to claim 1, wherein the second portion has a depth greater than the third depth of the first region.

5. The semiconductor device according to claim 1, wherein the second portion has substantially the same depth as the third depth of the first portion.

6. The semiconductor device according to claim 5, wherein a depth of the trench is shallower than the third depth of the first portion.

7. The semiconductor device according to claim 1, further comprising:
a first contact provided on one surface of the substrate and contacting the source region; and
a second contact formed over one surface of the substrate and contacting the drain region.

8. The semiconductor device according to claim 1, wherein a source-drain current path is arranged, in the first direction between the first low-concentration region and the second low-concentration region, along the portion of the channel region sideward, in the second direction, from the side surface of the trench.

9. A semiconductor device comprising:
- a device isolation film formed in a substrate and having a first depth in the substrate;
- a first semiconductor region of a first conductivity formed in the substrate and serving as a source region;
- a second semiconductor region of the first conductivity formed in the substrate and serving as a drain region;
- a channel region of a second conductivity arranged, in the substrate, in a first direction between the first semiconductor region and the second semiconductor region;
- a trench formed in the substrate between the first semiconductor region and the second semiconductor region and having a side surface extending in the first direction between the first semiconductor region and the second semiconductor region;
- a gate insulating film formed in the trench; and
- a gate electrode formed in the trench through the gate insulating film and having a second depth in the substrate,
- wherein the second depth of the gate electrode serves as a gate width such that a portion of the channel region sideward, in a second direction crossing the first direction, from the side surface of the trench is arranged between the first semiconductor region and the second semiconductor region,
- wherein one of the first semiconductor region and the second semiconductor region includes a first portion extending in said substrate, having a third depth shallower than the first depth of the device isolation film and contacting the device isolation film at a depth shallower than the first depth of the device isolation film.

10. The semiconductor device according to claim 9, wherein a plurality of trenches are formed along the second direction.

11. The semiconductor device according to claim 9, wherein the one of the first semiconductor region and the second semiconductor region includes a second portion contacting the trench and extending below a lower corner of the trench.

12. The semiconductor device according to claim 11, wherein the second portion has a depth greater than the third depth of the first region.

13. The semiconductor device according to claim 11, wherein the second portion has substantially the same depth as the third depth of the first portion.

14. The semiconductor device according to claim 9, wherein a depth of the trench is shallower than the third depth of the first portion.

15. The semiconductor device according to claim 9, wherein a source-drain current path is arranged, in the first direction between the first low-concentration region and the second low-concentration region, along the portion of the channel region sideward, in the second direction, from the side surface of the trench.

* * * * *